United States Patent [19]

Havemann et al.

[11] Patent Number: 5,488,015

[45] Date of Patent: Jan. 30, 1996

[54] METHOD OF MAKING AN INTERCONNECT STRUCTURE WITH AN INTEGRATED LOW DENSITY DIELECTRIC

[75] Inventors: Robert H. Havemann, Garland; Shin-Puu Jeng, Plano; Bruce E. Gnade, Rowlett; Chih-Chen Cho, Richardson, all of Tex.

[73] Assignee: Texas Instruments Incorporated, Dallas, Tex.

[21] Appl. No.: 246,432

[22] Filed: May 20, 1994

[51] Int. Cl.⁶ ......................... H01L 21/441; H01L 21/469
[52] U.S. Cl. .......................... 437/195; 437/231; 437/238; 437/978; 148/DIG. 43; 148/DIG. 118
[58] Field of Search ..................... 437/235, 238, 437/978, 231, 195; 148/DIG. 43, DIG. 117, DIG. 118

[56] References Cited

U.S. PATENT DOCUMENTS

| | | | |
|---|---|---|---|
| 4,017,528 | 4/1977 | Unger et al. | |
| 4,141,055 | 2/1979 | Berry et al. | 361/410 |
| 4,619,839 | 10/1986 | Lehrer | 437/231 |
| 4,652,467 | 3/1987 | Brinker et al. | 427/246 |
| 4,885,262 | 12/1989 | Ting et al. | 437/231 |
| 4,987,101 | 1/1991 | Kaanta et al. | 437/927 |
| 5,023,208 | 6/1991 | Pope et al. | 501/12 |
| 5,079,188 | 1/1992 | Kawai | 437/231 |
| 5,103,288 | 4/1992 | Sakamoto et al. | 357/71 |
| 5,104,828 | 4/1992 | Morimoto et al. | 437/235 |
| 5,155,576 | 10/1992 | Mizushima | 357/71 |
| 5,270,267 | 12/1993 | Ouellet | 437/231 |
| 5,352,630 | 10/1994 | Kim et al. | 437/231 |
| 5,354,713 | 10/1994 | Kim et al. | 437/235 |

FOREIGN PATENT DOCUMENTS

| | | |
|---|---|---|
| 1-51625 | 2/1989 | Japan . |
| 1-59815 | 3/1989 | Japan . |
| 4-152656 | 5/1992 | Japan . |
| 6-84787 | 3/1994 | Japan . |
| 6-97163 | 4/1994 | Japan . |

OTHER PUBLICATIONS

S. Wolf, "Silicon Processing for the VLSIEVA" vol. II, 1990, Lattice Press, pp. 222–235, 238–239.

*Primary Examiner*—Brian E. Hearn
*Assistant Examiner*—Leon Radomsky
*Attorney, Agent, or Firm*—Richard A. Stoltz; Richard L. Donaldson; William E. Hiller

[57] ABSTRACT

This invention provides a semiconductor device and process for making the same with dramatically reduced capacitance between adjacent conductors and an interlayer dielectric construction which emphasizes mechanical strength, etch compatibility, and good heat transfer. This process can include applying a solution between conductors 24, and then gelling, surface modifying, and drying the solution to form an extremely porous dielectric layer 28. A non-porous dielectric layer 30 may be formed over porous layer 28, which may complete an interlayer dielectric and provide mechanical strength, heat transfer, and a solid layer for via etch. A novel process for creating the porous dielectric layer is disclosed, which can be completed at vacuum or ambient pressures, yet results in porosity, pore size, and shrinkage of the dielectric during drying comparable to that previously attainable only by drying gels at supercritical pressure.

9 Claims, 6 Drawing Sheets

METHOD OF MAKING AN INTERCONNECT STRUCTURE WITH AN INTEGRATED LOW DENSITY DIELECTRIC

FIELD OF THE INVENTION

This invention relates generally to the fabrication of dielectrics on semiconductor devices, and more particularly to methods and structures for reducing capacitive coupling on a semiconductor device using electrical insulators made of porous dielectric materials.

BACKGROUND OF THE INVENTION

Semiconductors are widely used in integrated circuits for electronic devices such as computers and televisions. These integrated circuits typically combine many transistors on a single crystal silicon chip to perform complex functions and store data. Semiconductor and electronics manufacturers, as well as end users, desire integrated circuits which can accomplish more in less time in a smaller package while consuming less power. However, many of these desires are in opposition to each other. For instance, simply shrinking the feature size on a given circuit from 0.5 microns to 0.25 microns can increase power consumption by 30%. Likewise, doubling operational speed generally doubles power consumption. Miniaturization also generally results in increased capacitive coupling, or crosstalk, between conductors which carry signals across the chip. This effect both limits achievable speed and degrades the noise margin used to insure proper device operation.

One way to diminish power consumption and crosstalk effects is to decrease the dielectric constant of the insulator, or dielectric, which separates conductors. Probably the most common semiconductor dielectric is silicon dioxide, which has a dielectric constant of about 3.9. In contrast, air (including partial vacuum) has a dielectric constant of just over 1.0. Consequently, many capacitance-reducing schemes have been devised to at least partially replace solid dielectrics with air.

U.S. Pat. No. 4,987,101, issued to Kaanta et al., on Jan. 22, 1991, describes a method for fabricating gas (air) dielectrics, which comprises depositing a temporary layer of removable material between supports (such as conductors), covering this with a capping insulator layer, opening access holes in the cap, extracting the removable material through these access holes, then closing the access holes. This method can be cumbersome, partially because it requires consideration of access hole locations in the design rules and alignment error budget during circuit design, as well as requiring extra processing steps to create and then plug the holes. This method may also create large void areas which have essentially no means of handling mechanical stress and heat dissipation.

U.S. Pat. No. 5,103,288, issued to Sakamoto, on Apr. 7, 1992, describes a multilayered wiring structure which decreases capacitance by employing a porous dielectric with 50% to 80% porosity (porosity is the percentage of a structure which is hollow) and pore sizes of roughly 5 nm to 50 nm. This structure is typically formed by depositing a mixture of an acidic oxide and a basic oxide, heat treating to precipitate the basic oxide, and then dissolving out the basic oxide. Dissolving all of the basic oxide out of such a structure may be problematic, because small pockets of the basic oxide may not be reached by the leaching agent. Furthermore, several of the elements described for use in the basic oxides (including sodium and lithium) are generally considered contaminants in the semiconductor industry, and as such are usually avoided in a production environment. Creating only extremely small pores (less than 10 nm) may be difficult using this method, yet this requirement will exist as submicron processes continue to scale towards a tenth of a micron and less.

Another method of forming porous dielectric films on semiconductor substrates (the term "substrate" is used loosely herein to include any layers formed prior to the conductor/insulator level of interest) is described in U.S. Pat. No. 4,652,467, issued to Brinker et al., on Mar. 24, 1987. This patent teaches a sol-gel technique for depositing porous films with controlled porosity and pore size (diameter), wherein a solution is deposited on a substrate, gelled, and then cross-linked and densified by removing the solvent through evaporation, thereby leaving a porous dielectric. This method has as a primary objective the densification of the film, which teaches away from low dielectric constant applications. Dielectrics formed by this method are typically 15% to 50% porous, with a permanent film thickness reduction of at least 20% during drying. The higher porosities (e.g. 40–50% ) can only be achieved at pore sizes which are generally too large for such microcircuit applications. These materials are usually referred to as xerogels, although the final structure is not a gel, but an open-pored (the pores are generally interconnected, rather than being isolated cells) porous structure of a solid material.

SUMMARY OF THE INVENTION

The present invention provides novel structures and methods for hybrid porous/non-porous dielectrics for use as semiconductor insulators. The structures combine a low dielectric constant (k generally less than 3.0 and preferably less than 2.0) porous material with non-porous dielectric materials in a manner which emphasizes the desirable aspects of both, for the primary purpose of decreasing unwanted capacitance between conductors formed on a semiconductor device. One of the problems recognized herein is the difficulty in producing devices with significant structure formed after the porous layer. By the methods of this invention, even multiple porous layers are possible, and construction of the device can be accomplished by sequential layered techniques.

Other problems with porous dielectrics recognized herein include: decreased mechanical strength and thermal conductivity compared to solid silicon dioxide; difficulty with anisotropic (directional) etching typically required for via formation; difficulty in forming patterned layers on top of porous layers; the hydrophilic (water-wanting) nature of many finely-pored (and especially silica) dielectrics; and general unsuitability of known porous dielectric-forming methods to practical submicron device construction. Methods and structures disclosed herein allow solution to these and other problems.

The present invention can provide a method for constructing a semiconductor device, with a primary purpose of decreasing unwanted capacitance between conductors formed on the device. Accordingly, the method can comprise providing a layer of patterned conductors formed on a semiconductor substrate, and forming a porous dielectric layer filling gaps between and covering the patterned conductors. The method can further comprise removing a top portion of the porous dielectric layer to expose at least the tops of the conductors. The method can further comprise depositing a non-porous dielectric layer over the conductors and porous layer. This non-porous layer is preferably comprised of a bottom sublayer conformally formed by e.g. chemical vapor deposition, or some other non-liquid technique, and a top sublayer formed from a spin-on glass or similar planarizing technique. The method can further comprise creating one or more metal-filled vias passing through the non-porous layer to provide electrical contact to the patterned conductors, and forming a second layer of conductors on top of this structure.

The present invention can also provide structures for semiconductor devices with reduced intralayer capacitance, comprising at least a first and second conductor formed on a semiconductor substrate, with a porous dielectric between the first and second conductors. The porous dielectric preferably has an average height of 75% to 150% the height of the conductors. The porous dielectric also preferably has an average pore diameter of less than 80 nm (more preferably between 2 nm and 25 nm). The porous dielectric also preferably has a porosity between 30% and 95% (more preferably between 50% and 75%). The device may further comprise a non-porous dielectric layer deposited over the tops of the conductors and the porous dielectric, preferably at least 50% the height of the conductors, as measured over a conductor.

BRIEF DESCRIPTION OF THE DRAWINGS

This invention, including various features and advantages thereof, can be best understood by reference to the following drawings, wherein.

DETAILED DESCRIPTION OF THE PREFERRED EMBODIMENTS

Figure 1:
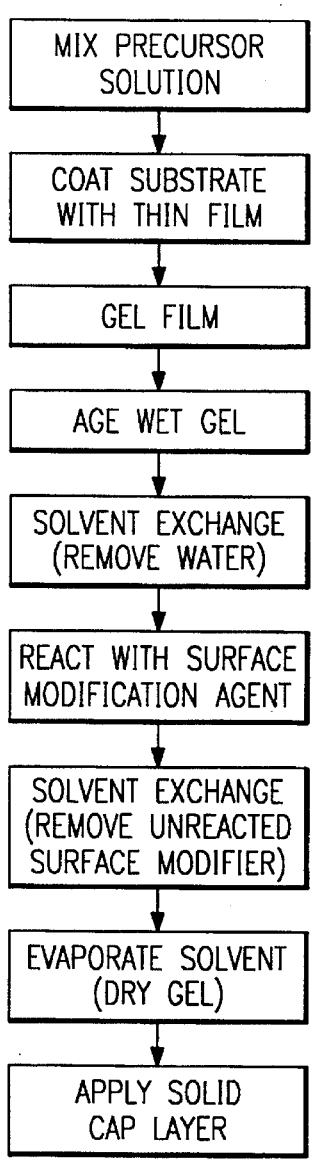
FIG. 1 shows a block diagram of the steps in a typical embodiment of the invention.

Typical embodiments of the invention are described with a porous dielectric method which may be comprised of the steps shown in FIG. 1, although not all steps shown may be required in a given embodiment. Furthermore, materials may be substituted in several of the steps to achieve various effects, and processing parameters such as times, temperatures, pressures, and relative concentrations of ingredients may be varied over broad ranges. In any case, another method which produces a similar porous dielectric layer could be substituted for the method of FIG. 1. In FIG. 1, various precursor solutions (some of which are described in detail in the specific examples) nay be mixed, and then applied to a substrate upon which a layer of patterned conductors has been formed. The method of application may be, for example, a spin-on technique in a controlled atmosphere which limits solvent evaporation. The object of the application in at least one embodiment is to form a layer of the precursor which will at least substantially fill the gaps between adjacent conductors. The precursor solution is allowed to gel on the substrate, a process which typically takes from 1 minute to 12 hours, depending on the solution and method of gelling. The wet gel can be allowed time to age, generally about a day (although it may be much shorter), at one or more controlled temperatures. If the wet gel contains water, one or more washing steps can be used to perform a solvent exchange on the gel, thereby removing the water but leaving the gel in a wet state. The solvent may be either a protic (e.g. ethanol) or an aprotic (e.g. acetone or hexane) solvent. The wet gel may then be reacted with a surface modification agent (the effects of the surface modification step will be explained below) by a method such as immersing the structure in a mixture containing the surface modification agent mid a solvent in which the modification agent is soluble. This solvent must also be miscible with the solvent already present in the wet gel. Another solvent exchange may be subsequently used to remove excess surface modification agent from the structure. The solvent is allowed to evaporate out of the gel, leaving a porous dielectric structure. If the film is substantially undensified during drying, the dried gel exhibits essentially the same structure as the wet gel (the dried film thickness is substantially the same as the wet gel film thickness). The porous dielectric may finally be capped with a non-porous insulation layer, as detailed in the specific examples.

Figure 2A:
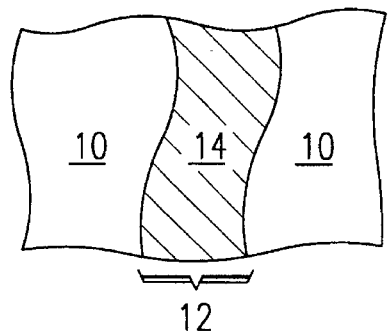
FIGS. 2A–2D show cross-sectional illustrations of a solvent-filled pore, before and during solvent evaporation.
Figure 2B:
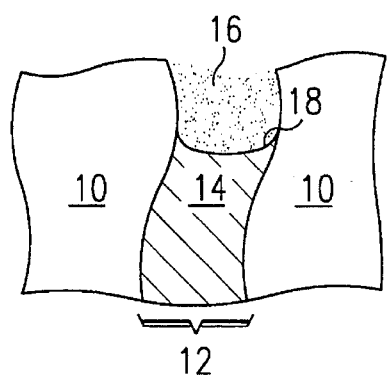

Referring to FIG. 2A, a cross-section of a single pore 12 in a wet gel structure 10 is shown, with a liquid pore fluid 14 filling pore 12. FIG. 2B shows the same pore undergoing evaporation of the pore fluid. A phase change (from liquid to vapor) is illustrated by the formation of a meniscus 18, which is shown as a crescent-shaped boundary between liquid pore fluid 14 and vapor 16 formed during evaporation. The meniscus is an indication of the surface tension of the pore fluid exerting an inward (usually, although some fluids can exert outward) pressure on the walls of the pore. This capillary pressure P can be related to the pore fluid surface tension $T_s$, the contact angle q (the angle at which the fluid meniscus contacts the surface of the pore), and the pore radius r, by the equation $$P = \frac{2T_s \cos q}{r} \quad (1)$$

The difficulty in maintaining the integrity of extremely small pores (small r) during drying is evident from this equation, since every halving of radius r doubles the pressure on the pore walls. Unfortunately, a porous dielectric suitable tier use between conductors should contain pores at least an order of magnitude smaller than the interconductor gap (r approximately 10 nanometers for a 0.2 micron gap, for example). Adjusting pore size upwards to relieve capillary pressure is therefore a limited option for microelectronic applications. On the other hand, simply allowing pores to collapse from the capillary pressure results in excessive shrinkage, with the corresponding densification of the dielectric defeating the primary purpose of the method (reducing dielectric constant) as well as preventing good surface adhesion.

To circumvent the capillary pressure problem in monolithic xerogel synthesis, the aerogel technique has been developed. Generally, this variation of the xerogel technique removes a solvent from a wet gel under supercritical pressure and temperature conditions. By removing the solvent in the supercritical region, vaporization of the liquid solvent does not take place; instead, the fluid undergoes a constant change in density during the operation, changing from a compressed liquid to a superheated vapor with no distinguishable state boundary. This technique avoids the capillary pressure problem entirely, since no state change boundaries ever exist in the pores. Adapting the aerogel technique to semiconductor fabrication appears to be problematic and expensive; typical solvent candidates have high critical pressures (e.g. ethanol, 924 psi, carbon dioxide, 1071 psi) which make application difficult in most circumstances. For instance, these pressures may tend to crush previous layers of porous dielectric capped under atmospheric pressure or force the wet gel into the pores of previous porous dielectric layers left uncapped, and may require containment of the wet gel at the edges of the wafer to prevent the gel from being squeezed off the wafer before the gel can be dried. Nevertheless, a highly porous, finely pored dielectric structure may be formed by this process under some conditions, making this supercritical technique possibly useful in the practice of the present invention.

Figure 2C:
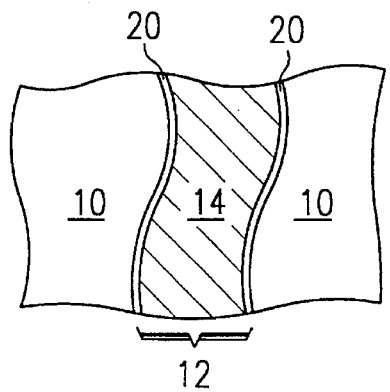
Figure 2D:
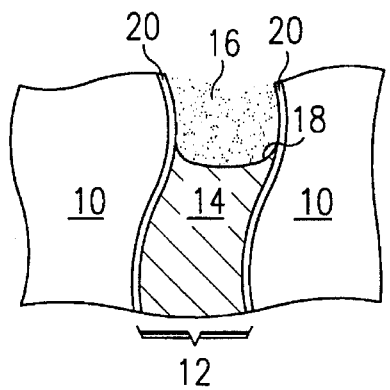

As an alternative to this, the present invention includes a group of novel techniques which may be applied at a range of pressures from vacuum to near-critical, with atmospheric pressure being preferable due to ease of handling and compatibility with previous porous layers. One similarity in these techniques is that a surface modification step is performed on the wet gel, replacing a substantial number of the molecules on the pore walls with those of another species. This surface modification typically replaces reactive surface groups such as hydroxyls and alkoxyls with more stable surface groups such as methyl groups, thereby controlling undesirable condensation reactions (and shrinkage effects) during gel drying. FIG. 2C shows a cross-section of a pore after the surface modification step; portions of gel 10 which are on the surface of pore 12 (labeled as region 20) now contain a different species. It has been discovered that by controlling the percentage of reactive surface groups replaced during the surface modification, the final shrinkage may be adjusted from the large shinkage typical of an unmodified xerogel (with uncontrolled shrinkage) to a shrinkage of only a few percent, heretofore only achievable with an aerogel technique. Typically, approximately 30% of the reactive surface groups must be replaced to substantially alleviate densification. Furthermore, the replacement surface species may be chosen because of its wetting properties in combination with specific pore fluids; thus in FIG. 2D, meniscus 18 is significantly flatter than that of FIG. 2B, resulting in a pore fluid contact angle closer 90 degrees. As the fluid contact angle approaches 90 degrees, the cosine of the contact angle q goes to 0, and the capillary pressure P of Equation 1 is reduced proportionally. It is believed that the surface modification prevents surface condensation reactions, and may also reduce capillary pressure by changing pore fluid contact angle, thereby allowing pores in the surface modified gel to better survive drying. This novel technique can produce a dielectric layer, at atmospheric pressure, with average pore diameter, porosity, and overall shrinkage resembling those of supercritically-dried aerogels.

An additional benefit of the surface modification can be hydrophobicity. It has been found that, for example, replacing only 15% of the reactive surface groups with methyl groups may be sufficient to cause the structure to be hydrophobic. This is an important feature for any material used in semiconductor processing, but particularly so for porous materials. If the porous surfaces are left hydrophilic (waterwanting), the structure is in many ways analagous to a common household sponge, which may hold many times its weight in water. However, the extremely small pore sizes allow a hydrophilic porous dielectric to rapidly gather water out of the surrounding air, the prevention of which would be an added difficulty during device fabrication. By making the pores hydrophobic before the gel is dried, these types of difficulties may be avoided.

Figure 3A:
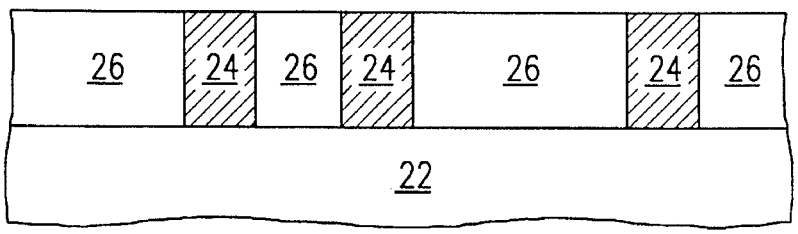
FIGS. 3A–3D show cross-sections of a portion of a semiconductor device, illustrating several steps in the application of an embodiment of the invention to a typical device.
Figure 3B:
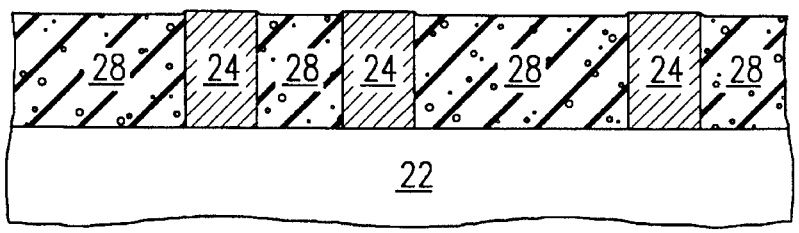

In accordance with the present invention, FIGS. 3A–3D show cross-sections of a semiconductor device at various stages during fabrication. During the description of the embodiments use of the word wafer will imply a wafer as used in conventional semiconductor processing, with at least the illustrated semiconductor device incorporated therein. In FIG. 3A, three patterned conductors 24 (e.g. of aluminum alloyed with a small amount of copper) are shown formed on an insulating layer 22, which may contain vias or through holes (not shown) for providing electrical contact between conductors 24 and lower layers of the device. A precursor solution 26 is shown disposed between conductors 24, after application to the wafer, for example, by a spin-on technique. The precursor may be prepared, for example, by the following 2-step process. First, TEOS stock, a mixture of tetraethylorthosilicate (TEOS), ethanol, water, and HCl, in the approximate molar ratio 1:3:1:0.0007, is prepared by stirring these ingredients under constant reflux at 60 degrees C. for 1.5 hours. Secondly, 0.05M ammonium hydroxide is added to the TEOS stock, 0.1 ml for each ml of TEOS stock. Since the addition of the ammonium hydroxide to the stock greatly increases gelation rate, the solution must be quickly applied to the wafer (it may be possible to switch the order of these two steps). After the solution is applied to the wafer, care should be taken to insure that the thin film does not dry prematurely; preferably, the wafer containing the solution/gel remains immersed either in liquid or in a saturated atmosphere at all times prior to the drying stage. Gelation and aging may preferably be accomplished by letting the device sit in a saturated ethanol atmosphere for approximately 24 hours at about 37 degrees C. Next, the water may be removed from the wet gel, preferably by immersing the wafer in pure ethanol. The surface modification step may then be performed, preferably by immersing the wafer in a hexane solution containing about 10% by volume trimethylchlorosilane (TMCS). After a brief reaction time, the unreacted surface modification compound is usually removed by immersing the wafer in an aprotic solvent (e.g. acetone, hexane) and allowing excess solvent to drain. After this solvent exchange, solvent is finally allowed to evaporate from the wet gel 26. This may produce a structure similar to that of FIG. 3B, which illustrates the dried gel now forming a porous dielectric layer 28, and also illustrates the few percent shrinkage typical of this method (the dried porous film thickness is only slightly less than the wet gel thickness). One advantage of this and similar embodiments is that the surface-modified porous dielectric layer is hydrophobic, whereas an otherwise similar supercritically-dried aerogel (without surface modification) tends to be hydrophilic unless subsequently treated.

Figure 3C:
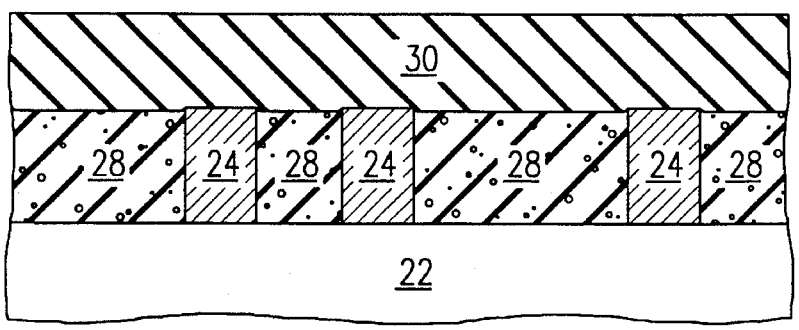
Figure 3D:
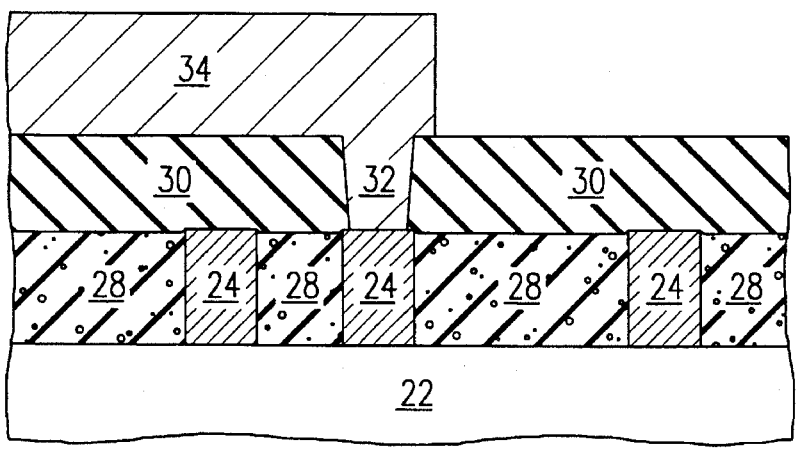

It is preferable to, as shown in FIG. 3C, cap porous layer 28 with a substantially non-porous dielectric layer 30 to seal the open-pored structure, mechanically reinforce the device, and to provide a non-porous layer for via etching and constructing further metal/dielectric layers. This layer may be comprised of silicon dioxide, silicon nitride, a composite layer having silicon dioxide and silicon nitride sublayers, silicon oxynitride, an organic insulator, or similar materials, applied by a method such as chemical vapor deposition (CVD) or as a spin-on glass (SOG). FIG. 3D shows a via etched through non-porous layer 30 and filled with a conducting material to provide a metal-filled via 32, thereby providing a means for electrical connection between a conductor 24 and a second layer of patterned conductors 34, one of which is shown. The non-porous layer in this embodiment forms the majority of the interlayer dielectric. Although the solid dielectric may provide little or no reduction in layer-to-layer capacitance, excellent interlayer mechanical properties are maintained. This is preferred, because it achieves low intralayer capacitance and, at the same time, generally retains mechanical properties of a completely solid intra/interlayer dielectric. This recognizes that intralayer capacitance reduction is much more important than interlayer capacitance reduction.

Figure 4A:
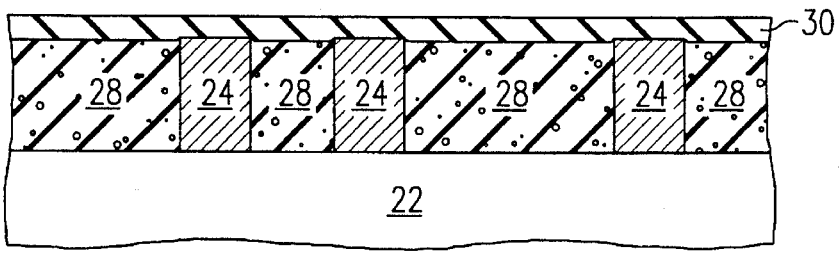
FIGS. 4A–4C show cross-sections of another semiconductor device, illustrating two separate applications of the present invention.
Figure 4B:
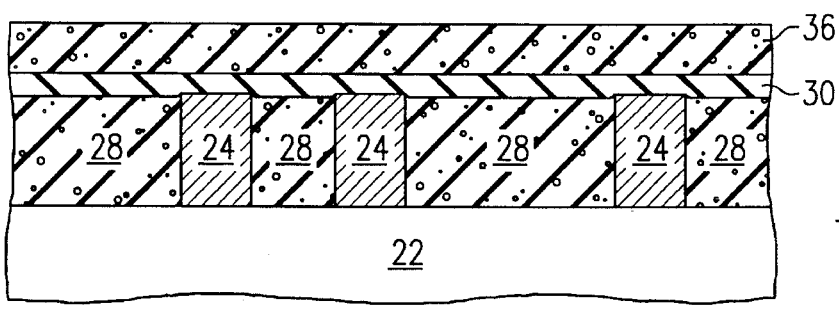
Figure 4C:
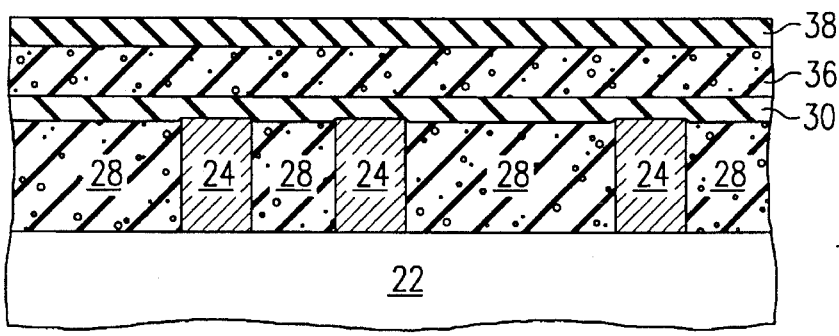

FIGS. 4A–4C show a second embodiment with a different dielectric configuration. FIG. 4A shows a structure similar to that of FIG. 3C, with the one exception being that non-porous dielectric layer 30 is too thin to form the interlayer dielectric. Referring to FIG. 4B, a second porous dielectric layer 36 is created, for example, by coating non-porous dielectric layer 30 with a non-gelled precursor solution and repeating the steps of FIG. 1. A cap layer 38 may be deposited over second porous layer 36, as shown in FIG. 4C. Cap layer 38 may be formed, for instance, using similar materials and processes as those used to create non-porous layer 30. This embodiment can provide a substantially lower interlayer dielectric constant than the previous embodiment, possibly at the expense of some structural strength. However, the non-porous and cap layers can help control via formation, and the cap layer can provide a solid foundation for additional conducting layers.

Figure 5:
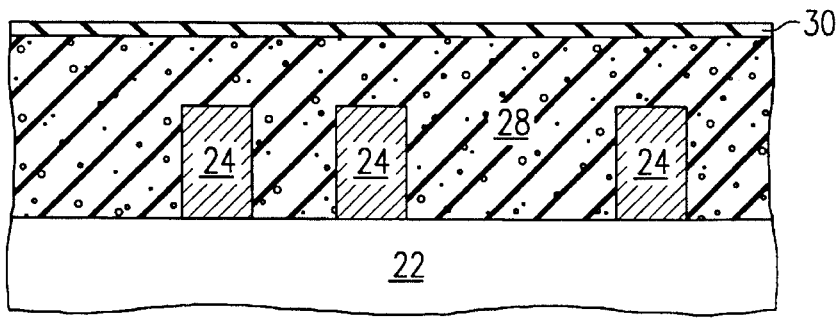
FIG. 5 shows a cross-section of another structure formed with the methods of the current invention, with a relatively thick porous dielectric and a relatively thin non-porous dielectric.

FIG. 5 illustrates an embodiment with only one porous and one non-porous dielectric layer, but with the intralayer and most of the interlayer dielectric generally formed by the porous layer. Porous dielectric layer 28 is preferably formed by increasing the deposited depth of the coating solution to completely cover the conductors to about the depth (measured from substrate 22) required to form the interlayer dielectric. This process may require depositing and gelling solution several times to build the required insulator thickness. Porous dielectric layer 28 may then be dried in accordance with one of the methods of the invention. A non-porous layer 30 may be applied over porous layer 28, for instance, using similar materials and processes as those used to firm non-porous layers in the previous embodiments.

Figure 6A:
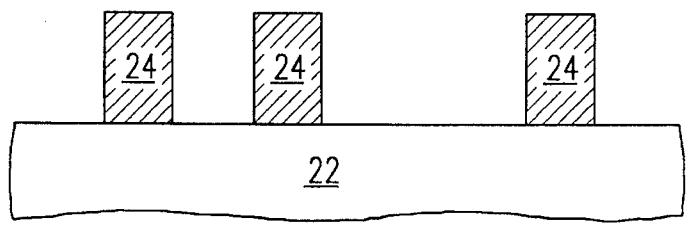
FIG. 6A–GH show cross-sections of yet another semiconductor device with a non-porous dielectric formed by two sublayers.
Figure 6B:
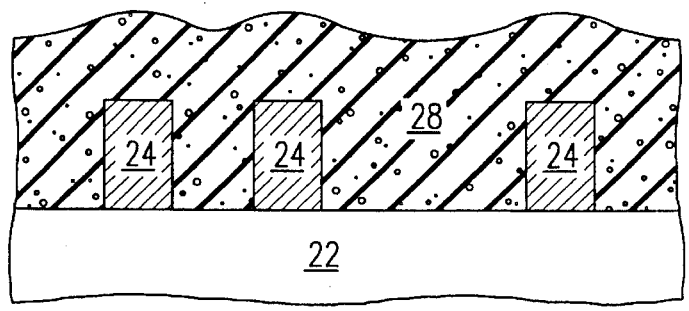
Figure 6C:
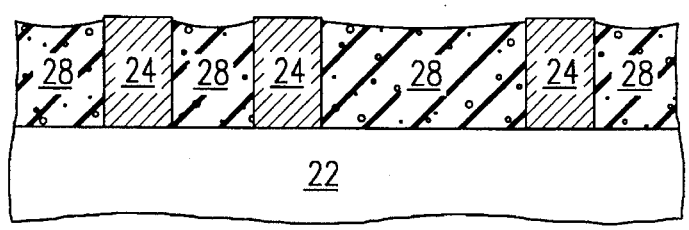
Figure 6D:
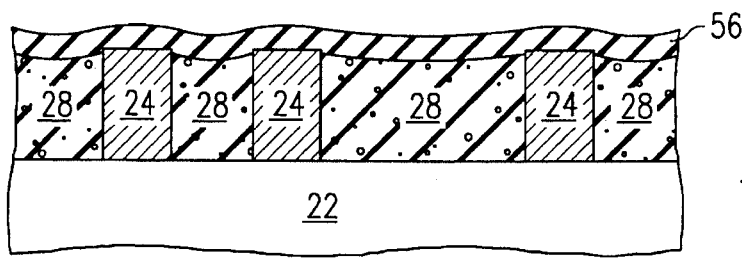
Figure 6E:
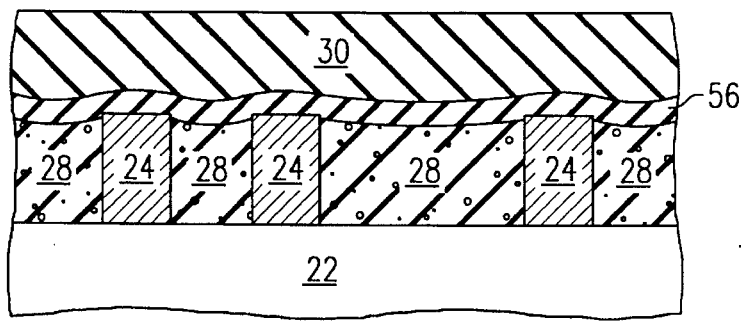

FIGS. 6A–6F show cross-sections of a device construction useful for porous intralayer dielectrics. FIG. 6A again shows patterned conductors 24 on a substrate 22. By a method such as those disclosed above, for example, a porous dielectric layer 28 is constructed to fill gaps between and cover conductors 24, with the dried structure possibly resembling FIG. 6B. FIG. 6C shows the structure after removal of a top portion of porous layer 28 to preferably expose the tops of conductors 24. The material removal may be accomplished, for example, by a controlled chemical etch, such as HF plasma etching, with concentrations and etch times strongly dependent on the dielectric porosity. Alternately, the material removal may be done with a mechanical polisher, using, for example, an aqueous colloidal suspension of silica. This recognizes that it may be easier (and therefore preferable) to deposit a thicker porous layer and etch it back than to more precisely deposit the porous layer only in the gaps between conductors. FIG. 6D shows a step of depositing, preferably by a chemical vapor deposition (CVD) technique, a conformal sublayer 56, of silicon dioxide for example, directly over the porous dielectric layer 28 and the conductors 24. A dry-processed CVD layer, which would primarily deposit near the top of the porous layer, may be preferable to spin-on glass (SOG), which may contain solvents capable of wetting the pores in porous layer 28. However, CVD is not particularly planarizing, and is a relatively slow method for forming a thick dielectric. FIG. 6E illustrates how a non-porous dielectric 30 may be applied over conformal sublayer 56, for example as an SOG oxide, to quickly complete a planarized interlayer dielectric.

Figure 6F:
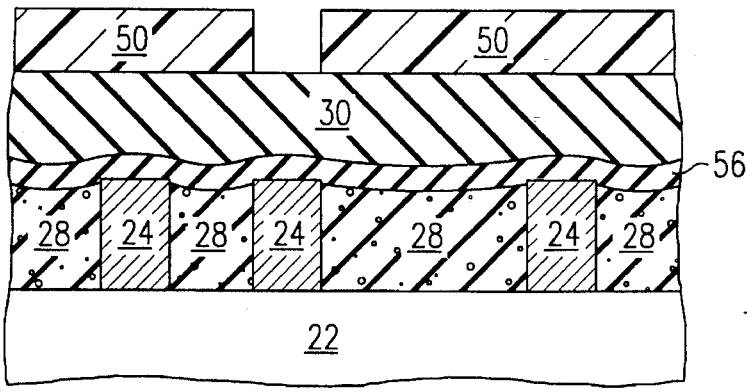
Figure 6G:
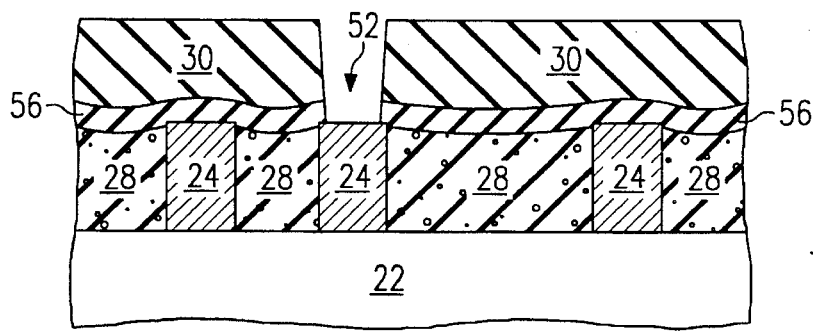
Figure 6H:
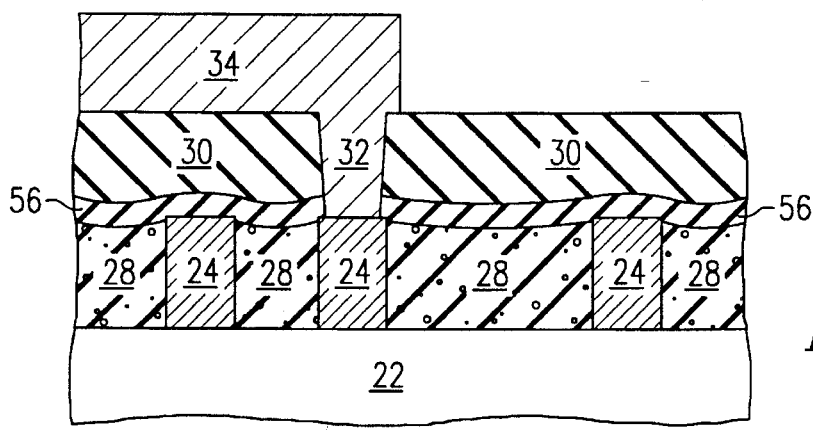

FIG. 6F shows the structure after deposition and patterning of a photoresist mask 50. This prepares the wafer for the etch of via 52 through layers 30 and 56, as shown in FIG. 6G. An advantage of this embodiment is that via 52 does not pass through porous dielectric 28, which may be a difficult material to pattern precisely. Finally, FIG. 6G shows a metal-filled via 32 and one of a second layer of patterned conductors 34, electrically connected by metal-filled via 32 to one of patterned conductors 24. This embodiment of the invention can provide excellent intralayer capacitance reduction, a good mechanical bond between porous and non-porous dielectrics, a straightforward construction technique with largely conventional via formation, and a planarized, non-porous interlayer dielectric with good mechanical and heat transfer characteristics.

Figure 7:
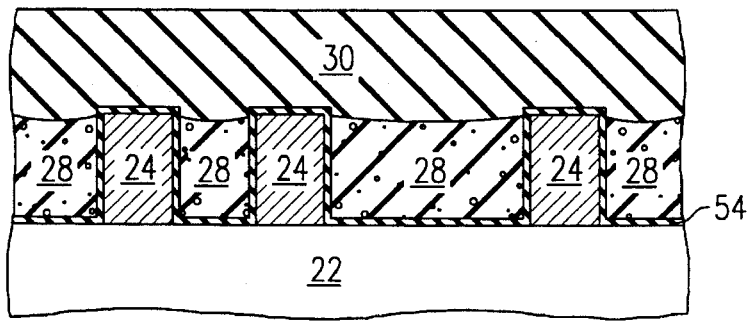
FIG. 7 shows a cross-section of a semiconductor device containing a passivation layer which isolates a porous dielectric layer from direct contact with the conductors.

FIG. 7 is included to illustrate an embodiment wherein porous dielectric layer 28 is isolated from conductors 24 by a relatively thin conformal passivation layer 54, which may be formed, for example, of a CVD silicon dioxide. This layer may be advantageous in several embodiments. In an embodiment such as that of FIG. 6, layer 54 may be removed from the tops of conductors 24 during etchback of porous dielectric 28.

Figure 8A:
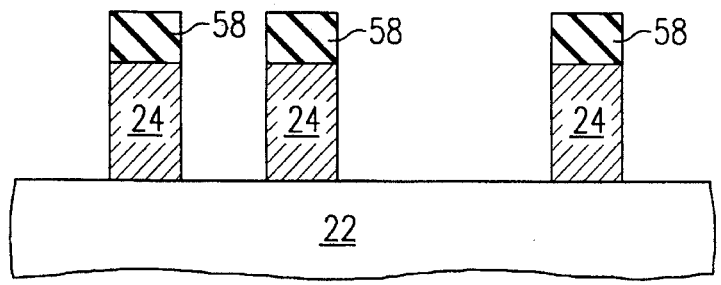
FIGS. 8A–8D show cross-sections of a semiconductor device with dielectric spacers affixed to the tops of conductors.
Figure 8B:
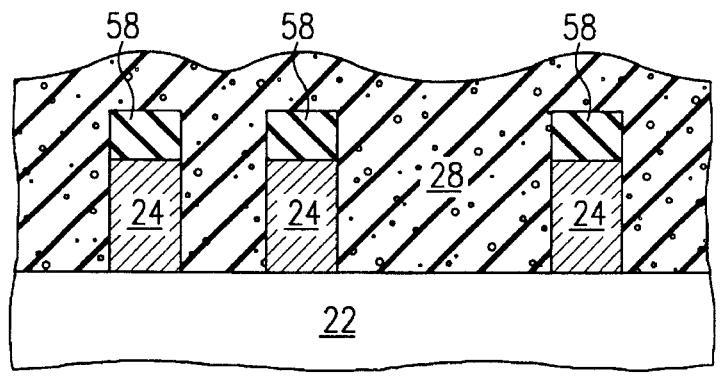
Figure 8C:
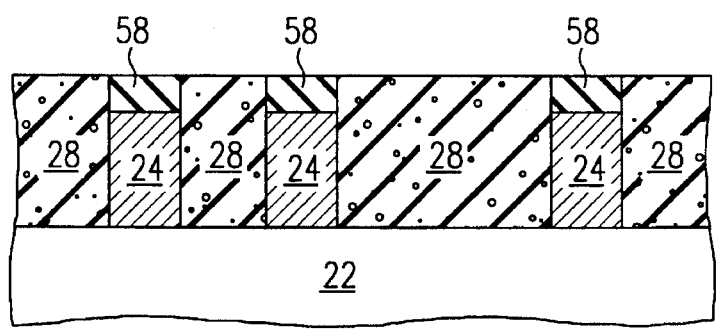
Figure 8D:
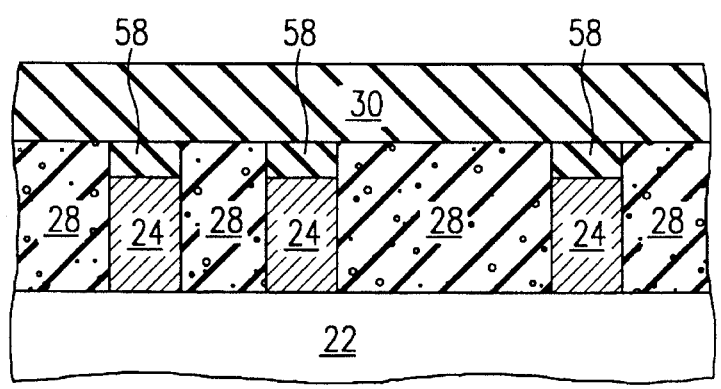

FIGS. 8A–8D illustrate an additional embodiment which includes dielectric spacers. In FIG. 8A, conductors 24 are patterned with dielectric spacers 58 on top of them. The spacers are preferably formed of the same material used in non-porous layer 30 (shown on FIG. 8D). This may be accomplished by depositing a conducting layer, overlaying this with a dielectric layer of a material such as silicon dioxide, and patterning both with one mask. In FIG. 8B, a porous dielectric layer 28 has been formed to preferably cover spacers 58, as shown. FIG. 8C shows the device after a top portion of porous dielectric 28 has been removed. This step preferably exposes the tops of the spacers, and, as FIG. 8C illustrates, in practice a top portion of spacers 58 will probably be removed as well. Finally, FIG. 8D shows the device after non-porous dielectric 30 has been deposited over the structure to complete the interlayer dielectric. An advantage of this embodiment is that the addition of the spacers allows the removal of a top portion of the porous dielectric, without the possibility of removing a portion of the conductors. This structure may also result in lower crosstalk, as compared to the embodiment of FIG. 6.

The following table provides an overview of some embodiments cross-referenced to the drawings.

| Drawing Element | Preferred or Specific Examples | Generic Term | Other Alternate Examples |
| --- | --- | --- | --- |
| 22 | Previous interlayer dielectric | Substrate | Previously-formed layers of a semi-conductor device |
| 24, 34 | AlCu alloy and/or refractory metal | Conductors | Al, Cu, Mo, W, Ti, and alloys of these Polysilicon, silicides, nitrides, carbides |
| 26 | TEOS stock | Precursor solution | Solution of particulate or colloidal silicon, germanium, titanium, aluminum silicate ratioed TEOS/ MTEOS (methyl-triethoxysilane) stock, ratioed TEOS/ BTMSE (1,2-Bis-(trimethoxysilyl)-ethane) stock |
| 28, 36 | Surface-mod-ified dried gel | Porous dielectric layer | Supercritically-dried aerogel, other fine-pored porous dielectrics |
| 30, 38 | Silicon dioxide | Non-porous dielectric layer | Other oxides, B or P-doped $SiO_2$, silicon nitride, silicon oxynitride Parylene, polyimides, organic-containing oxide |
| 32 | AlCu alloy and/or refractory metal | Metal-filled via | Same as conductors above |
| 50 | | Photoresist | |
| 54 | Silicon dioxide | Passivation layer | Silicon nitride, silicon oxynitride |
| 56 | Silicon dioxide | Conformal sublayer | Silicon nitride, silicon oxynitride, organic-containing oxide |
| 58 | Silicon dioxide | Dielectric spacers | Same as non-porous dielectric layer |

The invention is not to be construed as limited to the particular examples described herein, as these are to be regarded as illustrative, rather than restrictive. The invention is intended to cover all processes and structures which do not depart from the spirit and scope of the invention. For example, one skilled in the art could apply one of the many other published methods of initially forming a wet gel from an appropriate precursor to this invention. Properties of some of the specific examples may be combined without deviating from the nature of the invention.

What is claimed is:

1. A method of constructing a semiconductor device comprising:

providing a layer of patterned conductors formed on a semiconductor substrate;

depositing and gelling a layer of a precursor solution on said substrate, thereby forming a wet gel layer having porous structure;

drying said wet gel layer without substantial densification of said porous structure, thereby forming a porous dielectric layer filling gaps between and covering said patterned conductors, said porous dielectric layer having a dielectric constant of less than 3.0, a porosity between 30% and 95%, and an average pore diameter of less than 80 nm;

removing a top portion of said porous dielectric layer; and depositing a non-porous dielectric layer over said conductors and said porous dielectric layer to complete an interlayer dielectric, whereby the capacitive coupling between conductors on the same level is substantially reduced compared to a solid silicon dioxide dielectric and the mechanical properties of said interlayer dielectric are essentially the same as that of non-porous silicon dioxide.

2. The method of claim 1, further comprising creating one or more metal-filled vias passing through said non-porous dielectric layer to provide electrical contact to said patterned conductors and forming a second layer of conductors over said non-porous dielectric layer.

3. The method of claim 1, further comprising surface treating said wet gel to render said wet gel hydrophobic prior to said drying said wet gel step.

4. The method of claim 1, further comprising before said porous dielectric forming step, conformally applying a passivation layer to said conductors.

5. The method of claim 1, wherein said step of depositing a non-porous dielectric layer comprises depositing bottom and top sublayers, said bottom sublayer deposited conformally and said top sublayer being a planarized layer.

6. The method of claim 5, wherein said bottom sublayer is deposited by a chemical vapor deposition process.

7. The method of claim 1, wherein said removing a top portion of said porous dielectric layer step comprises mechanically polishing said semiconductor device.

8. The method of claim 1, wherein said removing a top portion of said porous dielectric layer step exposes the tops of said conductors.

9. The method of claim 1, wherein said non-porous dielectric layer comprises the majority of said interlayer dielectric.

* * * * *